United States Patent
Becker et al.

(10) Patent No.: US 7,333,577 B2
(45) Date of Patent: Feb. 19, 2008

(54) METHOD FOR EQUALIZATION OF A DATA SIGNAL TAKING ACCOUNT OF INTERFERENCE CHANNELS

(75) Inventors: Burkhard Becker, Ismaning (DE); Bertram Gunzelmann, Königsbrunn (DE); Martin Krüger, München (DE); Xiaofeng Wu, Neubiberg (DE)

(73) Assignee: Infineon Technologies AG, Munich (DE)

( * ) Notice: Subject to any disclaimer, the term of this patent is extended or adjusted under 35 U.S.C. 154(b) by 707 days.

(21) Appl. No.: 10/919,910

(22) Filed: Aug. 17, 2004

(65) Prior Publication Data
US 2005/0063501 A1 Mar. 24, 2005

(30) Foreign Application Priority Data
Aug. 19, 2003 (DE) .............................. 103 38 050

(51) Int. Cl.
H04B 1/10 (2006.01)
(52) U.S. Cl. ..................... 375/350; 375/233; 375/341
(58) Field of Classification Search ........ 375/232–233, 375/262, 265, 346–350, 285; 370/342; 714/792, 714/795
See application file for complete search history.

(56) References Cited
U.S. PATENT DOCUMENTS
6,249,544 B1 * 6/2001 Azazzi et al. ............... 375/233
6,535,554 B1 * 3/2003 Webster et al. ............. 375/233
6,654,365 B1 * 11/2003 Sylvester et al. ........... 370/342
6,813,744 B1 * 11/2004 Traeber ...................... 714/795

OTHER PUBLICATIONS

"Suboptimal Multi-User MLSE with Partial Interference Cancellation by Tentative Decisions", Wolfgang Sauer-Greff and Andreas Pauly, IEEE 4th International Symposium on Spread Spectrum Techniques and Applications, vol. 3, Sep. 22-25, 1996, pp. 986-990.
"Reduced Complexity ML Multiuser Sequence Detection with Per-Survivor Interference Cancellation", Eduardo S. Esteves and Robert A. Scholtz, Conference Record of the Thirty-First Asilomar Conference on Signals, Systems & Computers, 1997, vol. 2, Nov. 2-5, 1997, pp. 1415-1419.
"Maximum Likelihood Receiver for Multiple Channel Transmission Systems", W. Van Etten, IEEE Transactions on communications, vol. 24, Issued Feb. 2, 1976, pp. 276-283.
"Interference Canceling Equalizer (ICE) for Mobile Radio Communication", Hitoshi Yoshino, Kazuhiko Fukawa and Hiroshi Suzuki, IEEE Transactions on Vehicular Technology, vol. 46, issued Nov. 4, 1997, pp. 849-861.

* cited by examiner

Primary Examiner—Khanh C. Tran
(74) Attorney, Agent, or Firm—Eschweller & Associates, LLC

(57) ABSTRACT

A method for equalization of a signal is provided, wherein the equalization is of a signal that is transmitted via a data channel based on the DF method. The method takes account of at least one interference channel, and includes processing of at least two trellis diagrams in each time unit, with the states of at least one of the trellis diagrams describing the data channel. A DF contribution that is used for processing of this trellis diagram includes information about at least one interference channel.

14 Claims, 13 Drawing Sheets

FIG 5  Trellis diagram for the interference source
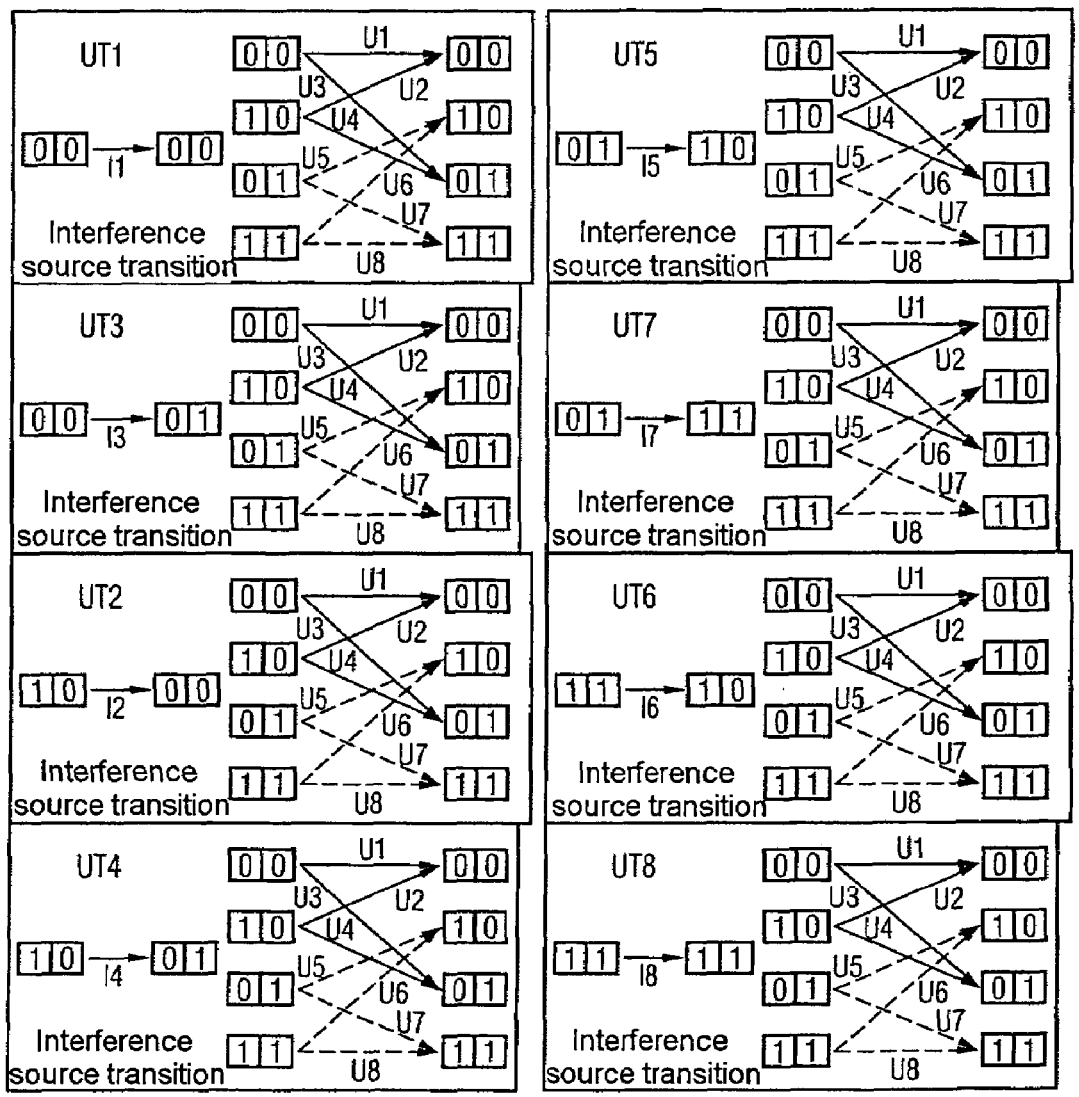

FIG 6   Trellis diagram for the interference source
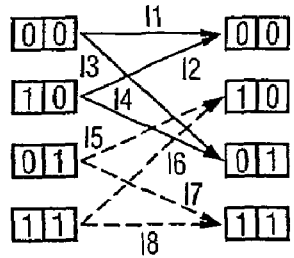
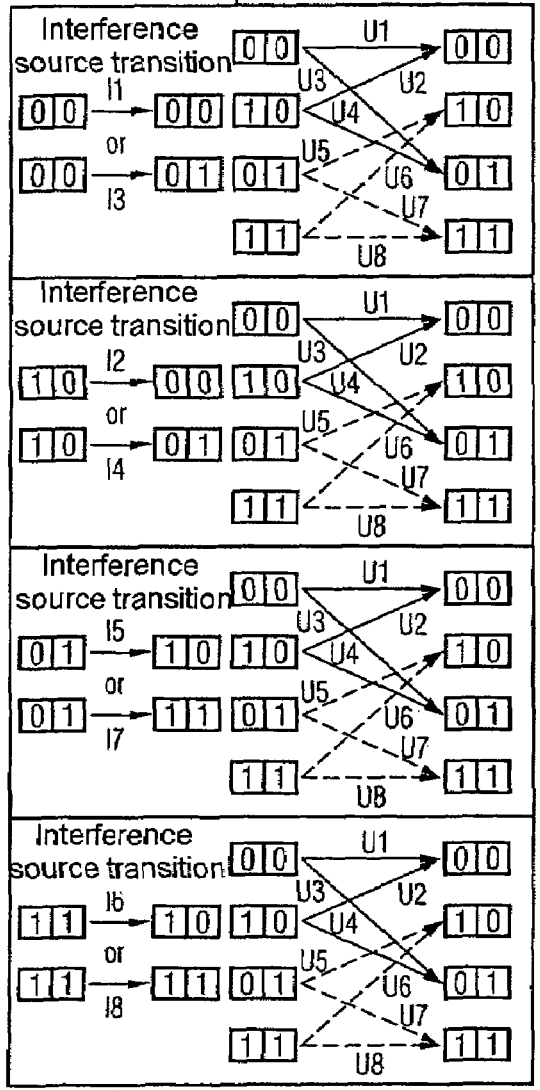
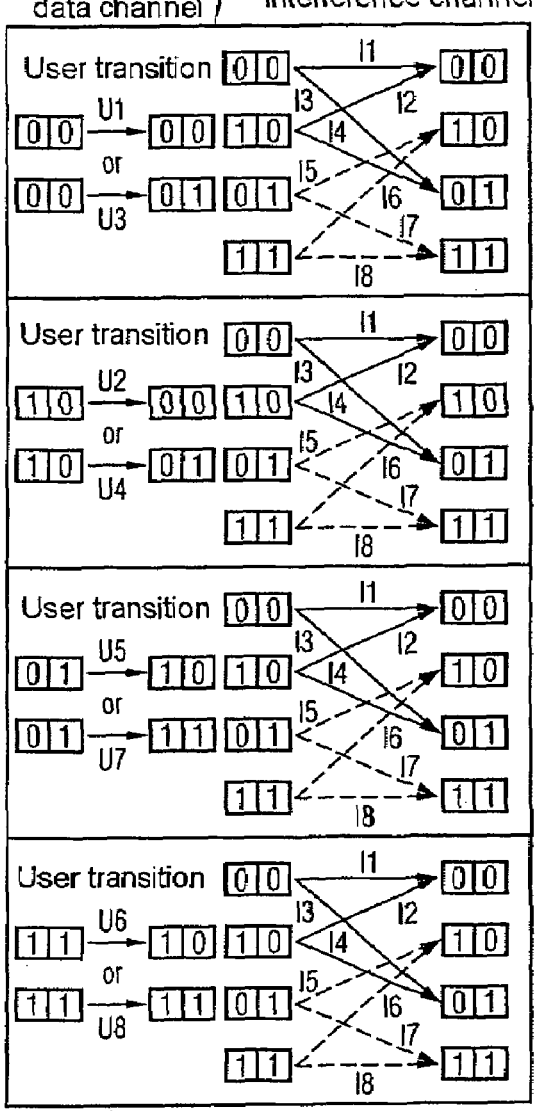

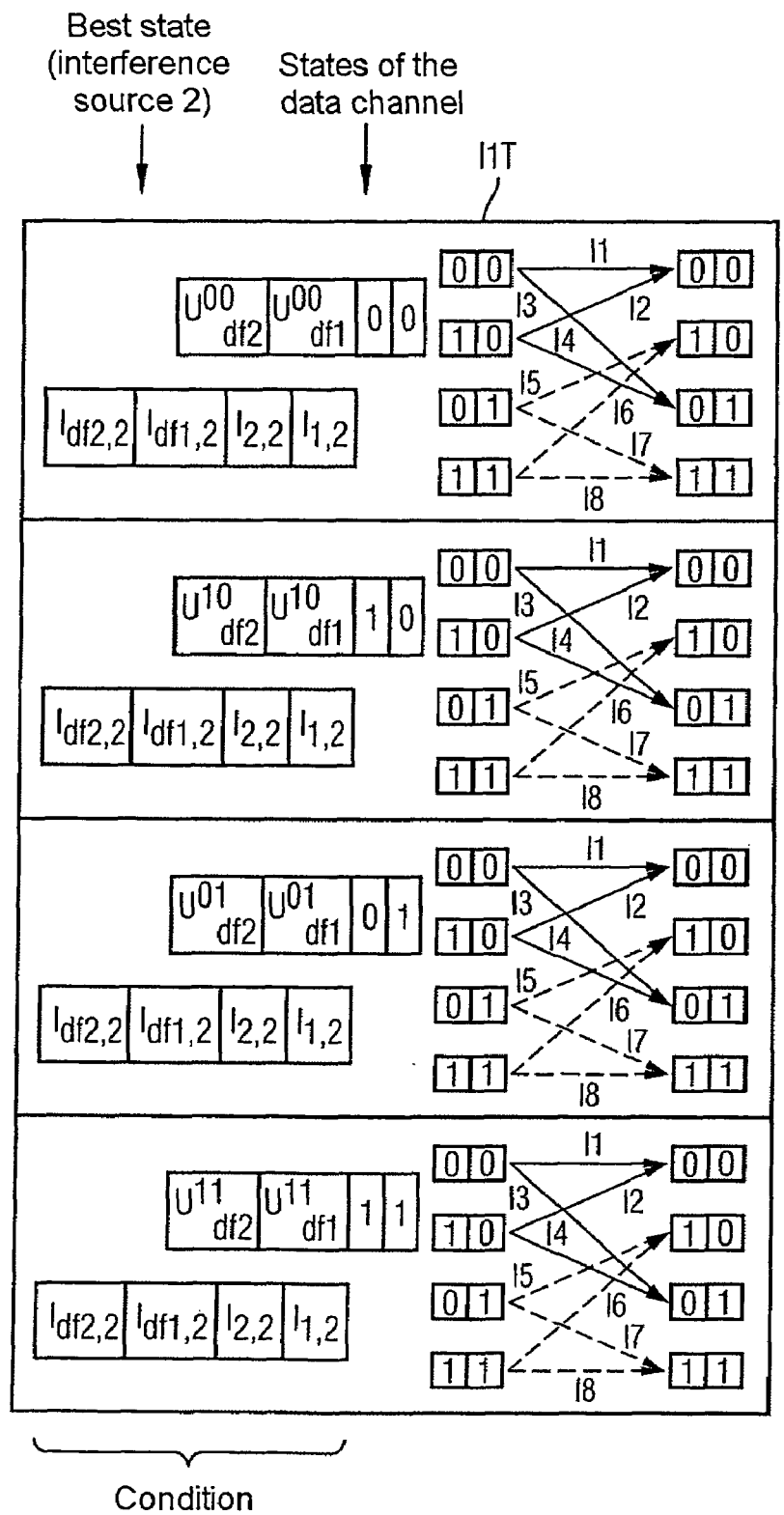
FIG 8 (Continued from page 7/13)

FIG 8 (Continued from page 8/13)
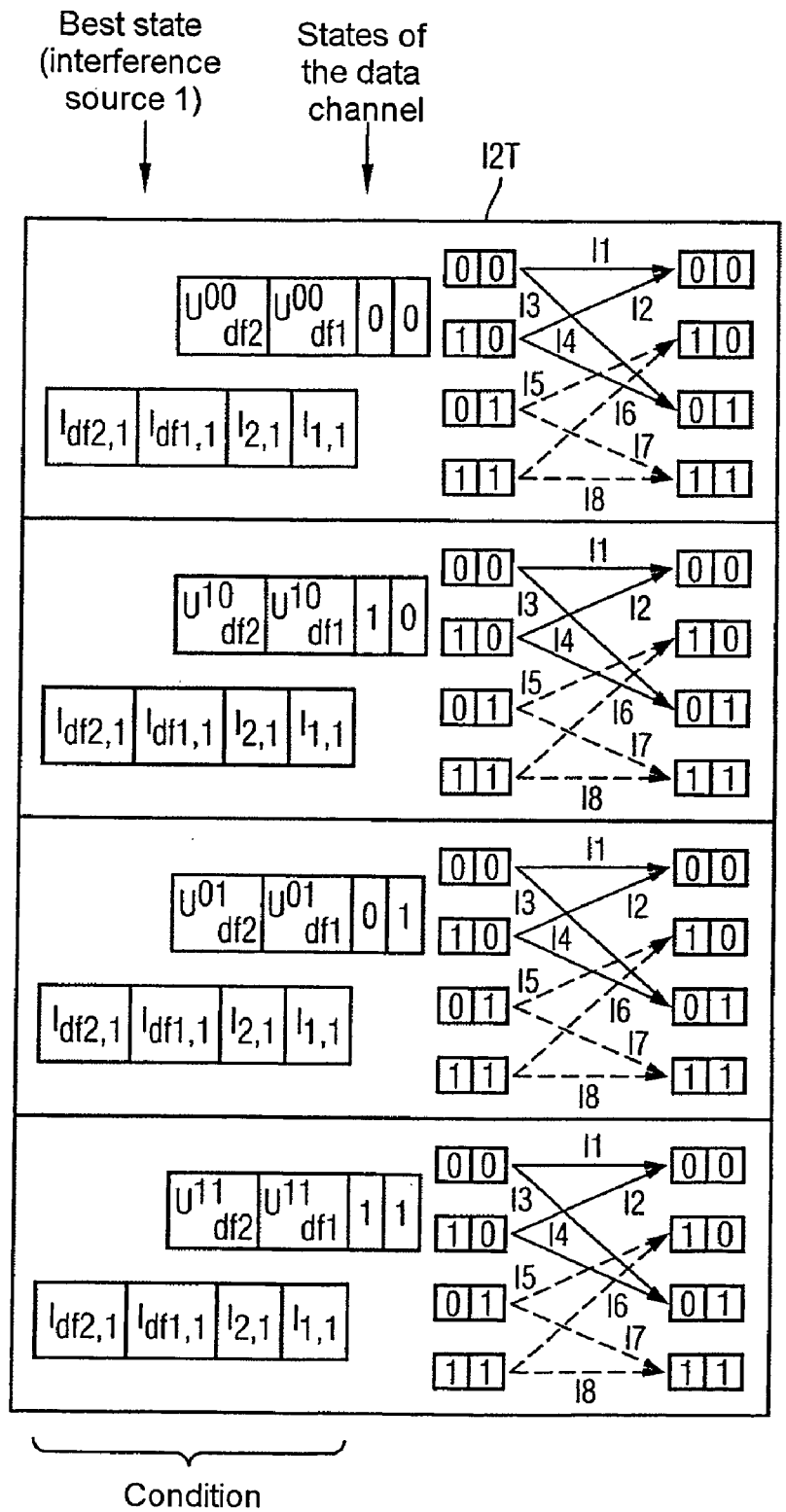

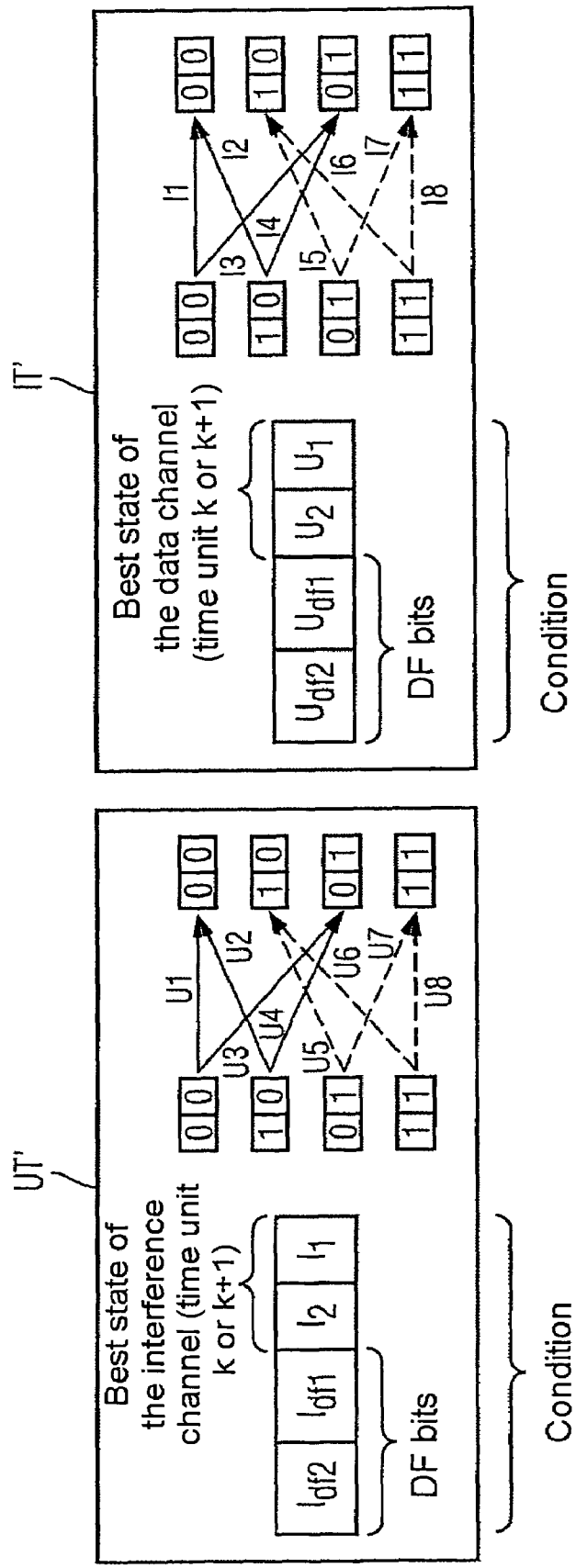

FIG 10
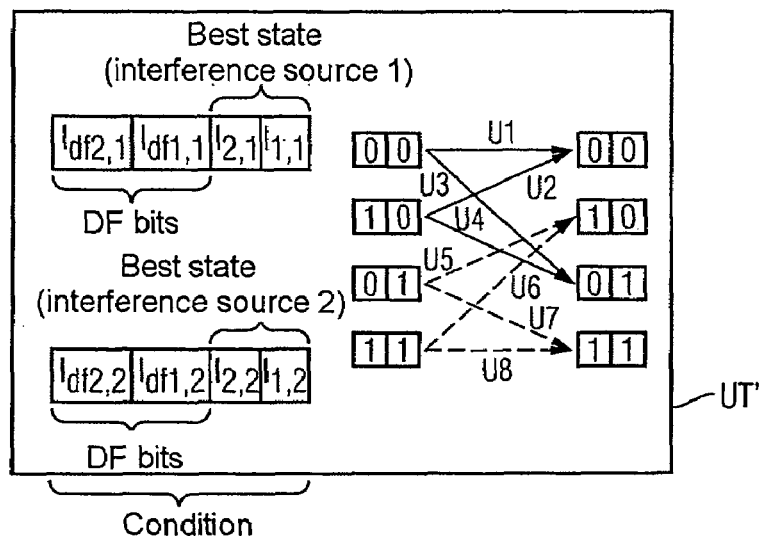
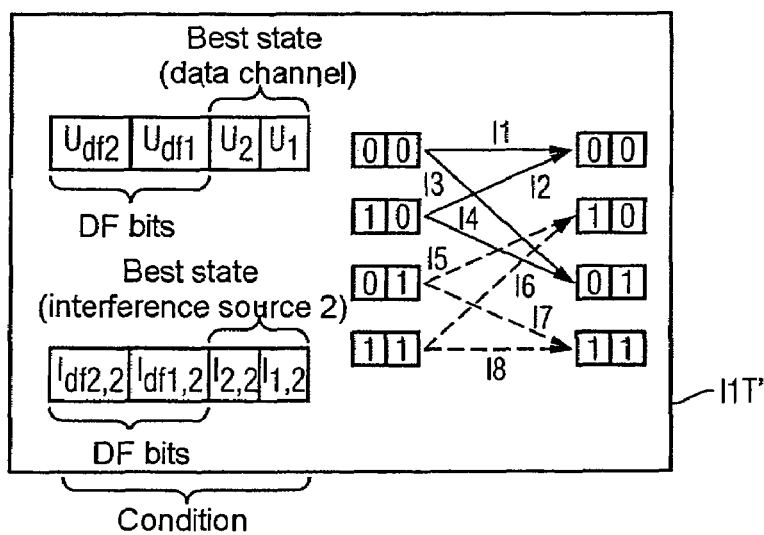
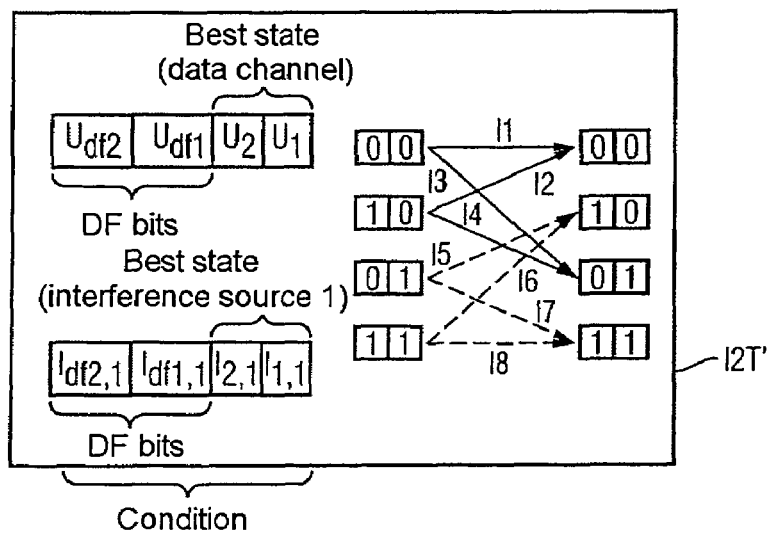

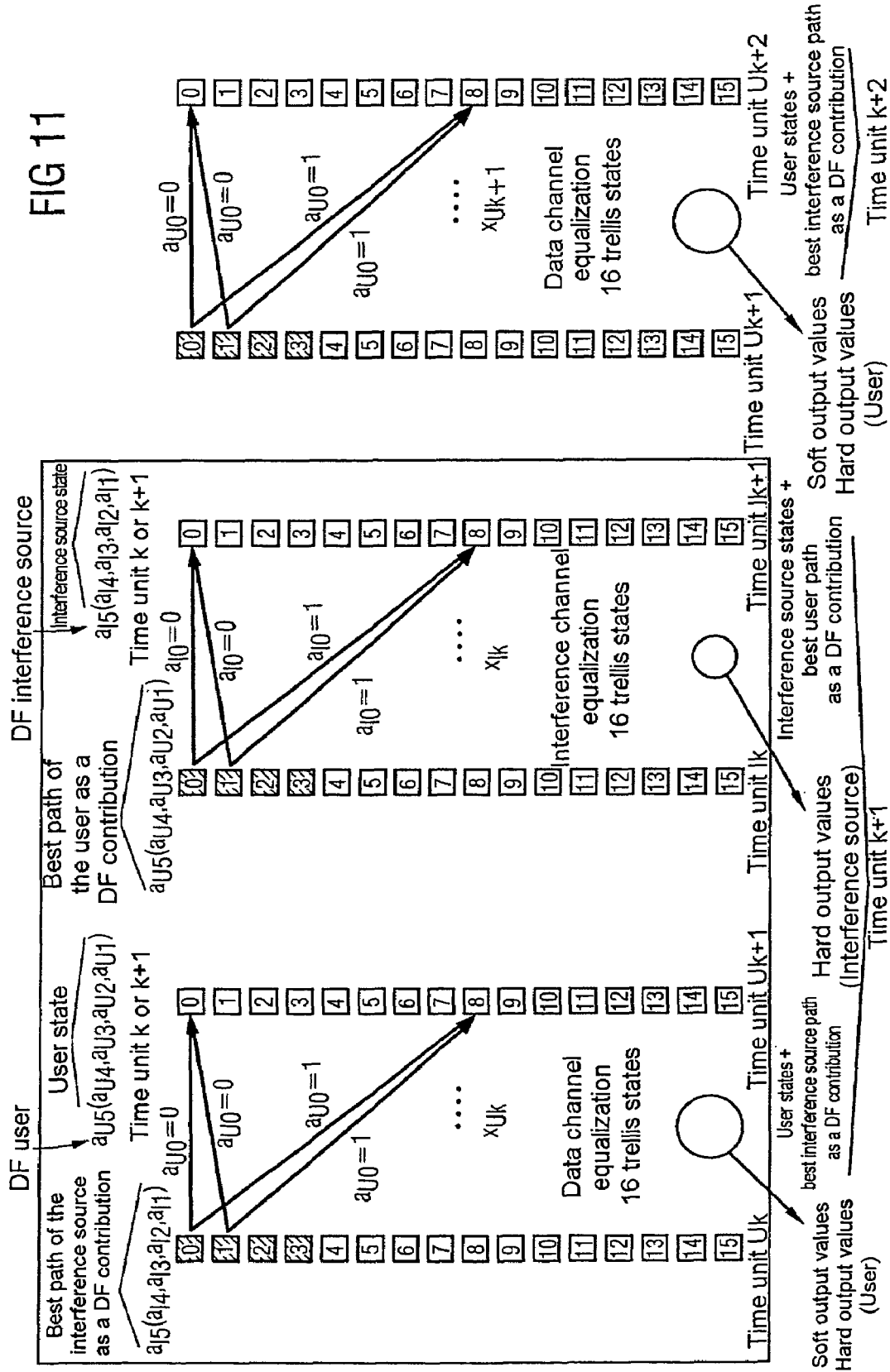

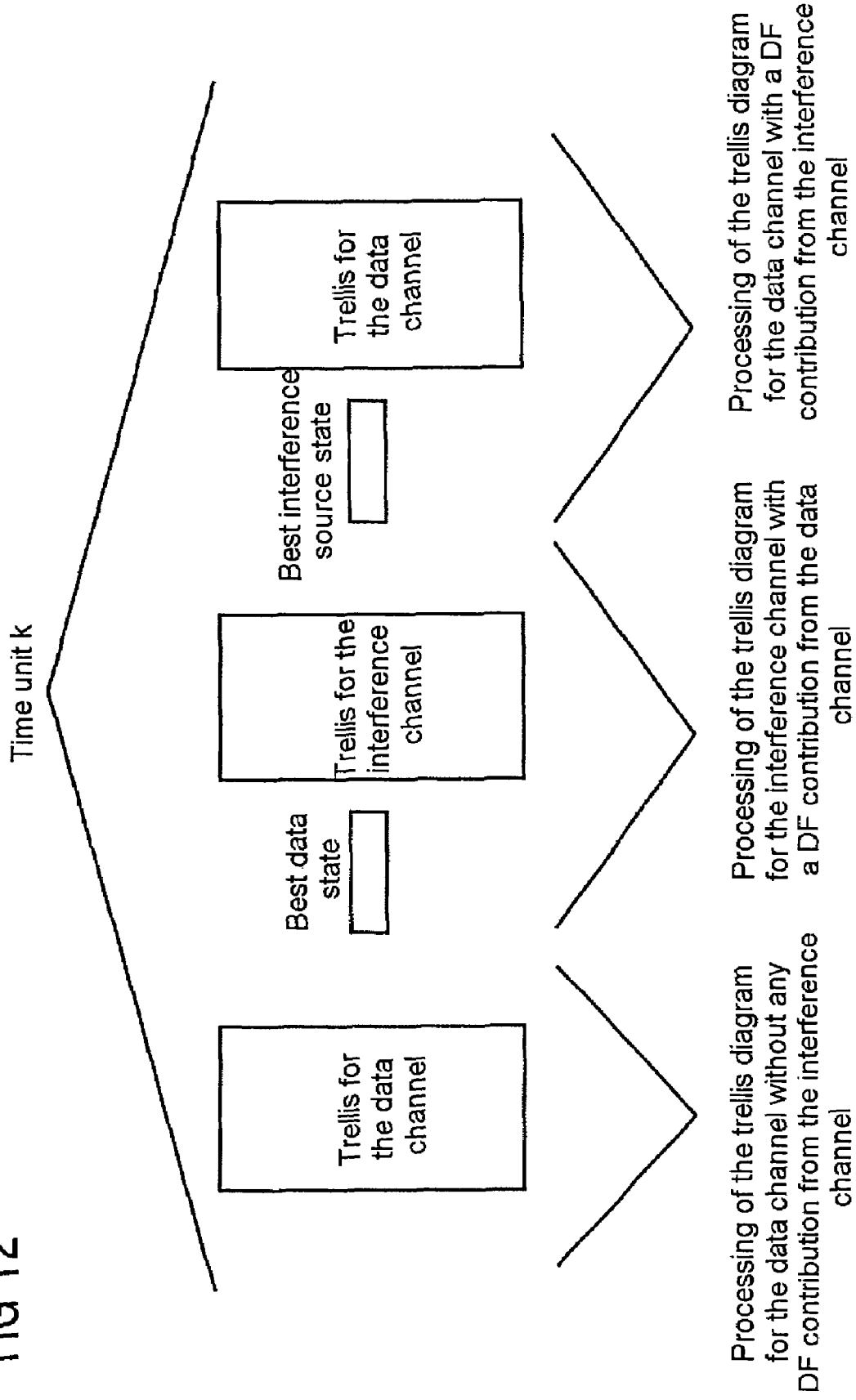

METHOD FOR EQUALIZATION OF A DATA SIGNAL TAKING ACCOUNT OF INTERFERENCE CHANNELS

REFERENCE TO RELATED APPLICATIONS

This application claims the benefit of the priority date of German application DE 103 38 050.7, filed on Aug. 19, 2003, the contents of which are herein incorporated by reference in their entirety.

FIELD OF THE INVENTION

The invention relates to a method for equalization of a signal that is transmitted via a data channel based on the DF (Decision Feedback) method and taking account of an interference channel.

BACKGROUND OF THE INVENTION

When radio signals are being transmitted between a transmitter and a receiver, various interference influences occur which have to be taken into account during the signal detection process at the receiver end. Firstly, the signal is subject to distortion that is caused because there are generally two or more possible signal propagation paths. Owing to reflection, scatter and diffraction of signal waves of obstructions, such as buildings, mountains and the like, the reception field strength of the receiver is composed of two or more signal components which generally have different strengths and are subject to different delays. This phenomenon, which is referred to as multipath propagation, causes the transmitted data signal distortion that is known as intersymbol interference (ISI).

Other active subscribers represent a further cause of interference. The interference that is caused by these subscribers is referred to as multi access interference: MAI.

First of all, only one channel will be considered, that is to say MAI will be ignored. This multipath transmission channel between the transmitter S and the receiver E can be modelled as a transmission filter H with channel coefficients $h_k$ as is illustrated in FIG. 1. The transmitter S feeds transmission symbols $s_k$ into the transmission channel, that is to say the channel model transmission filter H. A model adder SU allows an additive noise contribution $n_k$ to be taken into account, which is added to the transmission symbols $s_k$, which have been filtered with $h_k$, at the output of the channel model transmission filter H.

The index k denotes the discrete time in time limits of the symbol clock rate. The transmission signals $s_k$, which have been filtered by the transmission filter H and on which noise has been superimposed are received as the received signal $x_k$ by the receiver E, as follows:

$$x_k = \sum_{i=0}^{L} h_i s_{k-i} + n_k \quad (1)$$

where L represents the order of the transmission channel which is modelled by the filter H. As can be seen from equation 1, ISI is present, since $x_k$ depends not only on $s_k$ but also on $s_{k-1}, \ldots, s_{k-L}$.

FIG. 2 shows the channel model transmission filter H. The filter H is formed by a shift register comprising L memory cells Z. Taps (a total of L+1 of them) are in each case located in front of and behind each memory cell Z and lead to multipliers, which multiply the values of the symbols $s_k$, $S_{k-1}, \ldots, s_{k-L}$, which are inserted into the shift register via an input IN at the symbol clock rate T−1, by the corresponding channel impulse responses $h_0, h_1, \ldots h_L$. An output stage AD of the filter H adds the outputs of the L+1 multipliers. This thus results in an output signal OUT as in equation 1.

The memory content of the channel model shift register describes the state of the channel. The memory content of the first memory cell on the input side contains the symbol $s_{k-1}$ (which is multiplied by $h_1$) in the time unit k, and the other memory cells Z are occupied by the symbols $s_{k-2}$, $s_{k-3}, \ldots, S_{k-L}$. The state of the channel in the time unit k is thus uniquely governed by the details of the memory contents, that is to say by the L-tuple $(s_{k-L}, S_{k-L+1}, \ldots S_{k-1})$.

In the receiver E, the received signal values $x_k$ are known as sample values, and the channel impulse responses $h_0$, $h_1, \ldots, h_L$ for the channel are estimated at regular time intervals. The equalization task comprises the calculation of the transmission symbols $s_k$ from this information. The following text considers the equalization process by means of a Viterbi equalizer.

Viterbi equalization is based on finding the shortest path through a state diagram for the channel, and this is referred to as a trellis diagram. The channel states are plotted against the discrete time k in the trellis diagram. According to the Viterbi algorithm (VA), a branch metric, which represents a measure of the probability of the transition, is calculated for each possible transition between two states (previous state relating to the time unit k, destination state relating to the time unit k+1). The branch metrics are then added to the respective state metrics (which are frequently also referred to in the literature as path metrics) of the previous states (ADD). In the case of transitions to the same destination state, the sums obtained in this way are compared (COMPARE). That transition to the destination state under consideration whose sum of the branch metric and state metric of the previous state is the minimum is selected (SELECT) and forms the extension of the path leading into this previous state to the destination state. These three basic operations of the VA are known as ACS (ADD-COMPARE-SELECT) operations.

While, from the combinational point of view, the number of paths through the trellis diagram increases exponentially as k increases (that is to say as time progresses), the number remains constant for VA. This is because of the selection step (SELECT). Only the selected path (survivor) survives and can be continued further. The other possible paths are rejected. The recursive path rejection process is the fundamental concept of the VA and is an essential precondition for using calculations to solve the problem of searching for the shortest path (also referred to as the best path) through the trellis diagram.

The number of channel states (that is to say the number of occupancy options in the shift register H) in the trellis diagram is $m^L$, and this is identical to the number of paths that are followed through the trellis diagram. In this case, m denotes the significance of the data symbols under consideration. The computation complexity for the VA accordingly increases exponentially with L. Since L should correspond to the length of the channel memory of the physical propagation channel, the complexity for processing the trellis diagram increases as the channel memory of the physical propagation channel rises.

One simple method to reduce the computation complexity is to base the trellis processing on a short channel memory L of, for example, 2 or 3 time units (taps). However, this has a major adverse effect on the performance of the equalizer. The decision feedback method (DF) is a considerably more worthwhile measure for limiting the computation complexity, and does not have a serious influence on the quality of the equalizer. In the case of the DF method, the VA is based on a reduced trellis diagram, that is to say a trellis diagram in which only some of the $m^L$ channel states are considered, rather than all of them. If the trellis diagram is reduced to $m^{L_{DF}}$ trellis states ($L_{DF}$<L) the remaining $L-L_{DF}$ channel coefficients (which are not used for the definition of trellis states) are still considered by being used for the calculation of the branch metrics in the reduced trellis diagram.

A branch metric must be calculated for each possible transition between two states, both during the processing of the complete trellis diagram and during processing of the reduced trellis diagram (DF case). The branch metric is the Euclidean distance between the measured signal value or sample value $x_k$ and a reconstructed "hypothetical" signal value which is calculated and "tested" in the receiver for the destination state, the transition from previous state to the destination state and for the path history taking account of the channel knowledge.

By way of example, m is assumed to be equal to 2 (binary data signal), that is to say there are $2^L$ (DF case: $2^{L_{DF}}$) trellis states $(0, 0, \ldots, 0), (1, 0, \ldots, 0)$ to $(1, 1, \ldots, 1)$ comprising L tuples (DF: $L_{DF}$ tuples). One specific hypothetical previous state is assumed to be defined by the shift register occupancy $(a_L, a_{L-1}, \ldots, a_1)$ (only the $L_{DF}$ right-hand bits $(a_{L_{DF}}, \ldots, a_1)$ of the shift register occupancy are used for the state definition DF case). $a_0$ denotes the hypothetically transmitted symbol (bit) 0 or 1 which changes the previous state $(a_L, a_{L-1}, \ldots, a_1)$ for the time unit k to the destination state $(a_{L-1}, a_{L-2}, \ldots, a_0)$ for the time unit k+1 (DF: previous state $(a_{L_{DF}}, \ldots, a_1)$ to the destination state $(a_{L_{DF}-1}, \ldots, a_0)$). The branch metric $BM_k$, with or without DF, is:

$$BM_k = |\text{Sample value} - \text{reconstructed signal value}|^2$$

$$= \left| x_k - \left( \sum_{i=1}^{L} h_i(1 - 2 \cdot a_i) + h_0(1 - 2 \cdot a_0) \right) \right|^2$$

for $a_i = \{0, 1\}$ (2)

The reconstructed signal value (which is also referred to in the following text as the reconstructed symbol) is a sum of products of a channel coefficient and a symbol. For the DF case, the term $$\sum_{i=1}^{L} h_i(1 - 2 \cdot a_i)$$

can also be split into a trellis contribution and a DF contribution:

$$BM_k = \left| x_k - \left( \underbrace{\sum_{i=L_{DF}+1}^{L} h_i(1 - 2 \cdot a_i)}_{\text{DF contribution}} + \underbrace{\sum_{i=1}^{L_{DF}} h_i(1 - 2 \cdot a_i)}_{\text{Trellis contribution}} + \underbrace{h_0(1 - 2 \cdot a_0)}_{\substack{\text{hyp. symbol} \\ \text{contribution}}} \right) \right|^2 \quad (3)$$

This means that the reconstructed symbol comprises two (DF case: three) contributions: a contribution which is governed by the hypothetically transmitted symbol $a_0$ for the transition from the time unit k to the time unit k+1, the trellis contribution which is given by the previous state relating to the time unit k in the trellis diagram, and, in the case of DF, there is also the DF contribution which results from the reduced trellis states.

The branch metric $BM_k$ is always the same, with or without DF. The computation saving VA with DF results, as already mentioned, from the smaller number $2^{L_{DF}}$ of trellis states to be considered for the processing of the trellis diagram, that is to say from the reduction of the trellis diagram.

If it is also intended to take account of an interference channel (that is to say a second multipath transmission channel) in the equalization of a data signal, both channels (the data channel and the interference channel) must be subjected to VA equalization jointly. An overall trellis diagram that includes the states for both channels is constructed for this purpose. FIG. 3 shows an example of an overall trellis diagram such as this for m=2 (binary data signal) and L=2 for both channels. The trellis diagram for each individual channel in this case has (only) 4 states. The "combinational" overall trellis diagram on which the joint VA equalization of both signals is based comprises 4×4=16 states. Each state of the overall trellis diagram is represented by 4 bits, with the bits for the user and for the interference source being indicated alternately in FIG. 3 in order to define an overall state (combined user/interference source state). 4 transitions leave one state of the overall trellis diagram, and 4 transitions lead to each state in the overall trellis diagram. The transitions that lead to the combined states 0, 0, 0, 0, 0, 0, 1, 0 and 1, 1, 0, 0, 1, 1, 1, 0 are illustrated in FIG. 1. The four transitions are each composed of two transitions from the individual trellis diagrams.

If a further interference source is added, the overall trellis diagram already comprises 4×4×4=64 states (m=L=2 is likewise assumed for the other interference source). At the latest when a channel memory of L>2 is taken account of for each channel, the computation complexity rises to such an extent that conventional VA equalization of the overall trellis diagram is no longer possible.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention is based on a method that involves little complexity for equalization of a signal that is transmitted via a data channel based on the DF method and that takes account of at least one interference channel.

The basic idea of the invention accordingly comprises the processing of at least two trellis diagrams for equalization of a signal that is transmitted via a data channel using the DF method in each time unit, with the states of at least one of the trellis diagrams partially or exclusively describing the data channel, and a DF contribution which is used for the processing of this trellis diagram including information about the at least one interference channel. In other words, the interference channel is used via a DF contribution for the processing of a trellis diagram on which the VA algorithm for the equalization of the data channel is based. In the case of a two-value symbol alphabet (m=2), the computation complexity is only doubled instead of being multiplied by sixteen times by this measure when taking account of an interference source, and is tripled instead of being multiplied by sixty-four times when two interference sources are taken into account. On the other hand, this means that the path memory of the data channel and of the interference channels does not need to be restricted, that is to say it may for example still cover 5 time units (taps). In the case of the conventional method, as explained with reference to FIG. 3, for equalization of a data channel and interference channel, only a maximum channel memory of 2 taps can be taken into account, owing to the high computation complexity.

A first advantageous embodiment variant of the method according to the invention is characterized in that at least two trellis diagrams, both of which describe the data channel, are processed in each time unit. Processing of a trellis diagram that describes an interference channel is likewise required when the method is carried out in this way, in order to provide the DF information for the trellis diagram for the data channel. In particular, the information about the DF contributions that contain the interference channel or channels is obtained by separate processing of the trellis diagram for one interference channel, or for the two or more interference channels.

A second advantageous embodiment variant of the invention is characterized in that the states of one of the trellis diagrams describe the data channel subject to the condition of assumed states of the interference channel, and the information which is contained in the DF contribution which is used for processing of this trellis diagram, for at least one interference channel, is determined by trellis processing of the interference channel. The influence of the interference channel or channels (inter alia) from a DF contribution in the processing of the data channel trellis diagram is also taken into account in this method variant. In contrast to the first method variant, the trellis diagram for the data channel also takes account of states of the interference channel or channels in the form of a condition. In other words, the calculation of branch metric values with respect to state pairs of the data channel is carried out in different conditions (that is to say more than once), with the conditions being given by assumed states of the interference channel or channels. As in the first embodiment variant, the DF contribution is determined by trellis processing of the interference channel or channels.

In the situation where there is a single interference channel, at least two trellis diagrams are processed in each time unit in the second method variant. The trellis diagram for the interference channel is preferably processed in such a way that its states describe the interference channel subject to the condition of assumed states in the data channel. A DF contribution that includes information about the data channel is used for processing the trellis diagram that describes the interference channel.

In the situation where there are two interference channels, at least three trellis diagrams are processed in each time unit in the second method variant. The states of the other two trellis diagrams (that is to say of the trellis diagrams which do not describe the data channel) describe the first interference channel subject to the condition of assumed states of the data channel and in the second interference channel, and describe the second interference channel subject to the condition of assumed states in the data channel and in the first interference channel, respectively. A DF contribution which in each case includes information about the data channel and about the respective other interference channel is used for processing of the two trellis diagrams which describe the interference channels in order to calculate the branch metric values.

According to a third method variant, the states of one of the trellis diagrams describe the data channel, and the states of the other trellis diagram or diagrams in each case describes or describe one interference channel. The information that is contained in the DF contribution that is used for processing the trellis diagram that describes the data channel for at least one interference channel is determined by trellis processing of the trellis diagram that describes the interference channel. Furthermore, the data channel information that is contained in the DF contribution that is used for processing of the trellis diagram that describes one interference channel is determined by trellis processing of the trellis diagram that describes the data channel. In comparison to the second embodiment variant, this third embodiment variant is more simple, since no "conditional" states occur in the processing of the trellis diagram that describes the data channel and in the processing of the trellis diagram or trellis diagrams which describes or describe the interference channels. Conditional states are those states of the data channel (of the interference channel or channels) which are processed in the trellis diagram for the data channel (in the trellis diagram for the interference channel or in the trellis diagrams for the interference channels) subject to the assumption of the presence of a specific state of the interference channel or of specific states of the interference channels (of a specific state of the data channel).

For all of the method variants, it can be stated that the conditions for the processing of the conditional trellis diagrams can be determined either in the previous time unit or else in the current time unit. If the conditions are determined in the previous time unit and are used for the current time unit, this means less calculation complexity (the conditions result automatically during the processing of the conditional trellis diagram) or else a reduced calculation accuracy, since, in this case, it is not possible to obtain a reference to the current symbol in the calculation of the conditions. Only the previous symbols (exclusively of the current symbol) are, of course, taken into account in the previous time unit. If, on the other hand, it is also intended to take account of conditions for the current time unit and thus for the current symbol, the calculation of the conditions must be ensured separately in each time unit by processing of an additional trellis diagram (for the data channel and/or for the interference channel). The additional trellis diagram without any DF contribution from adjacent channels is processed and is used only to produce the DF contribution for the data channel or for the interference channel.

All of the method variants have the common feature that there is no need to carry out "brute force" equalization of the combinational overall trellis diagram but that, instead of this, at least two trellis diagrams of correspondingly smaller size can be processed in each time unit. As the three method variants explained above show, the information about one or more interference channels can in this case be taken into account in a different manner for the processing of the trellis diagram that describes the data channel.

BRIEF DESCRIPTION OF THE DRAWINGS

The invention will be explained in the following text using embodiment variants and with reference to the drawings, in which:

FIG. 5 shows a diagram which illustrates two trellis diagrams, which are associated with the data channel, and each have sixteen states which result from the eight trellis diagrams that are illustrated in FIG. 4, each having four states;

FIG. 6 shows an illustration which illustrates two trellis diagrams each having sixteen states, with the first trellis diagram describing the data channel subject to the condition that the states in the interference channel are known, and the other trellis diagram describing the interference channel subject to the condition that the states in the data channel are known, according to a second embodiment variant of the invention;

FIG. 9 shows an illustration to explain the processing of a trellis diagram which describes the data channel and of a trellis diagram which describes the interference channel, according to a third embodiment variant of the method according to the invention;

FIG. 10 shows an illustration, corresponding to FIG. 9, for the situation in which there is one data channel and two interference channels;

FIG. 11 shows an illustration of a trellis diagram which describes the states of the interference channel and of a trellis diagram which describes the states of the data channel for the time unit k, as well as an illustration of the trellis diagram which describes the states of the data channel for the time unit k+1, with an indication of the DF bits; and FIG. 12 shows an illustration in order to explain the calculation of a condition (best state of the interference channel) for the processing of the trellis diagram for the data channel, with the condition being determined in the current time unit k and, in consequence, in which the trellis diagram for the data channel is processed twice.

DETAILED DESCRIPTION OF THE INVENTION

In order to simplify the explanation of the invention, FIGS. 4 to 10 are each based on the assumption that m=LDF=2 for the data channel and for the interference channel or channels. This means that, ignoring external channels, the trellis diagrams contain only the states (0, 0), (1, 0), (0, 1), (1, 1). Transitions to these trellis diagrams are denoted by I1, I2, . . . , I8 for an interference channel (I: Interferer), and by U1, U2, . . . , U8 for the data channel (U: User). The transitions are:

U/I1: (0, 0)→(0, 0)
U/I2: (1, 0)→(0, 0)
U/I3: (0, 0)→(0, 1)
U/I4: (1, 0)→(0, 1)
U/I5: (0, 1)→(1, 0)
U/I6: (1, 1)→(1, 0)
U/I7: (0, 1)→(1, 1)
U/I8: (1, 1)→(1, 1)

Figure 1:
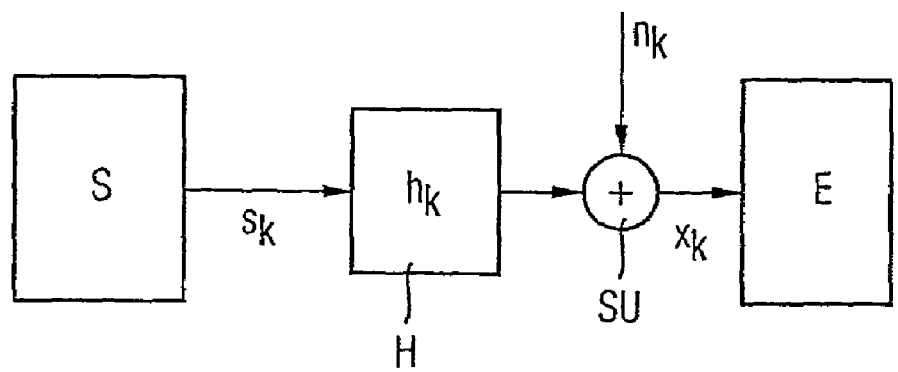
FIG. 1 shows a schematic illustration of a model of the physical transmission channel.
Figure 2:
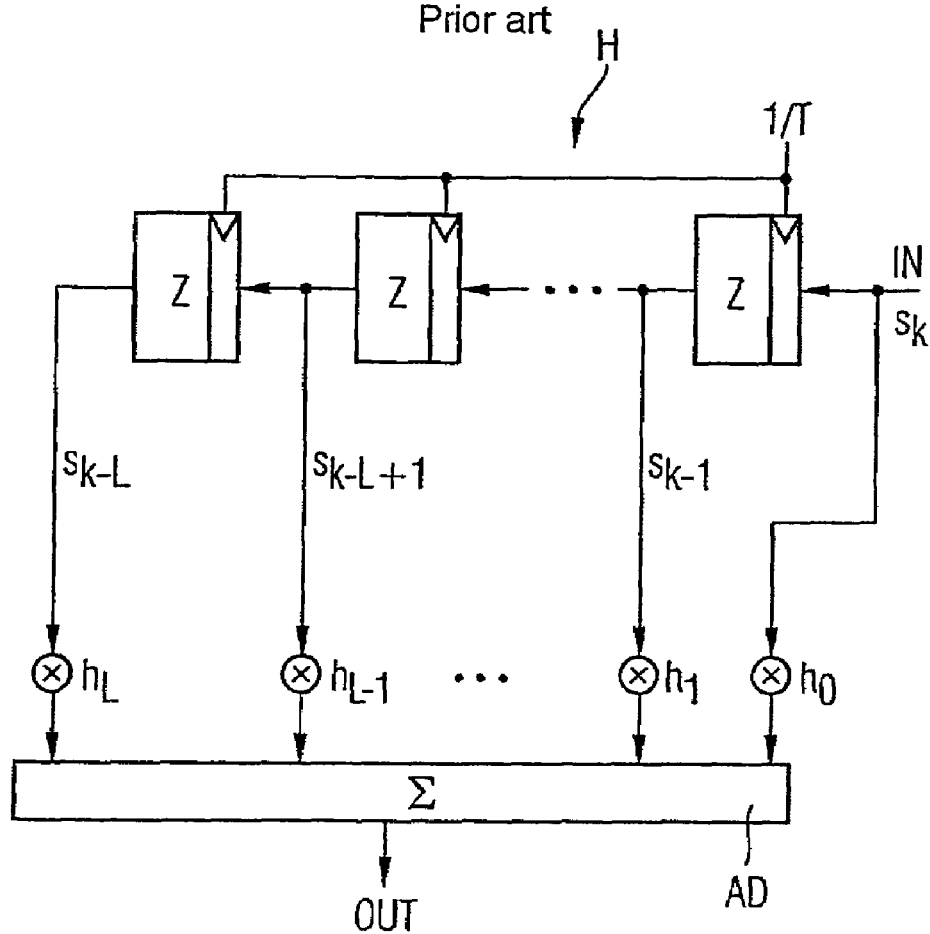
FIG. 2 shows the configuration of a model filter for modelling of a transmission channel.
Figure 3:
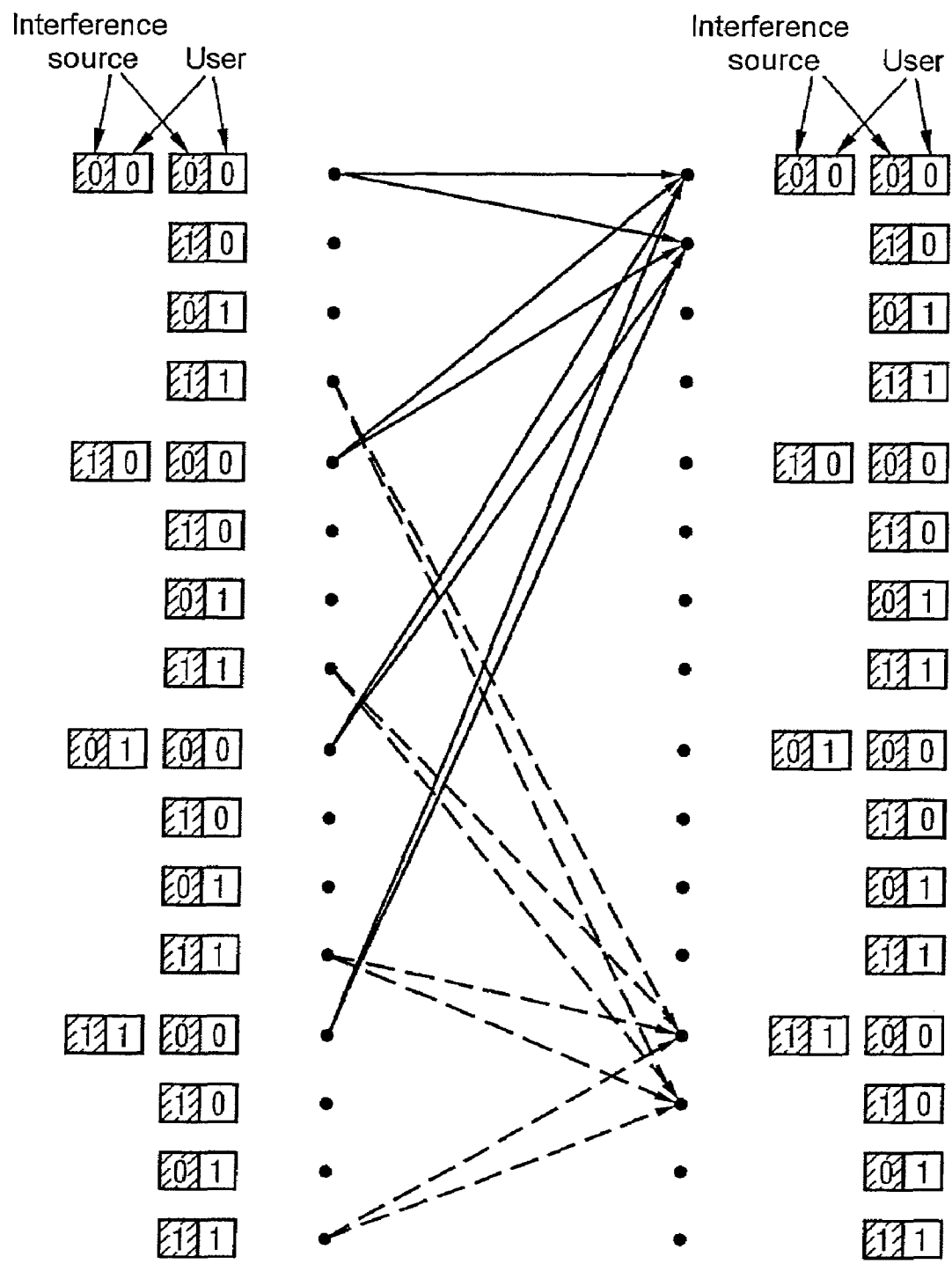
FIG. 3 shows an overall trellis diagram for the equalization of a data signal in the presence of an interference signal for L=2 and m=2 according to the prior art.
Figure 4:
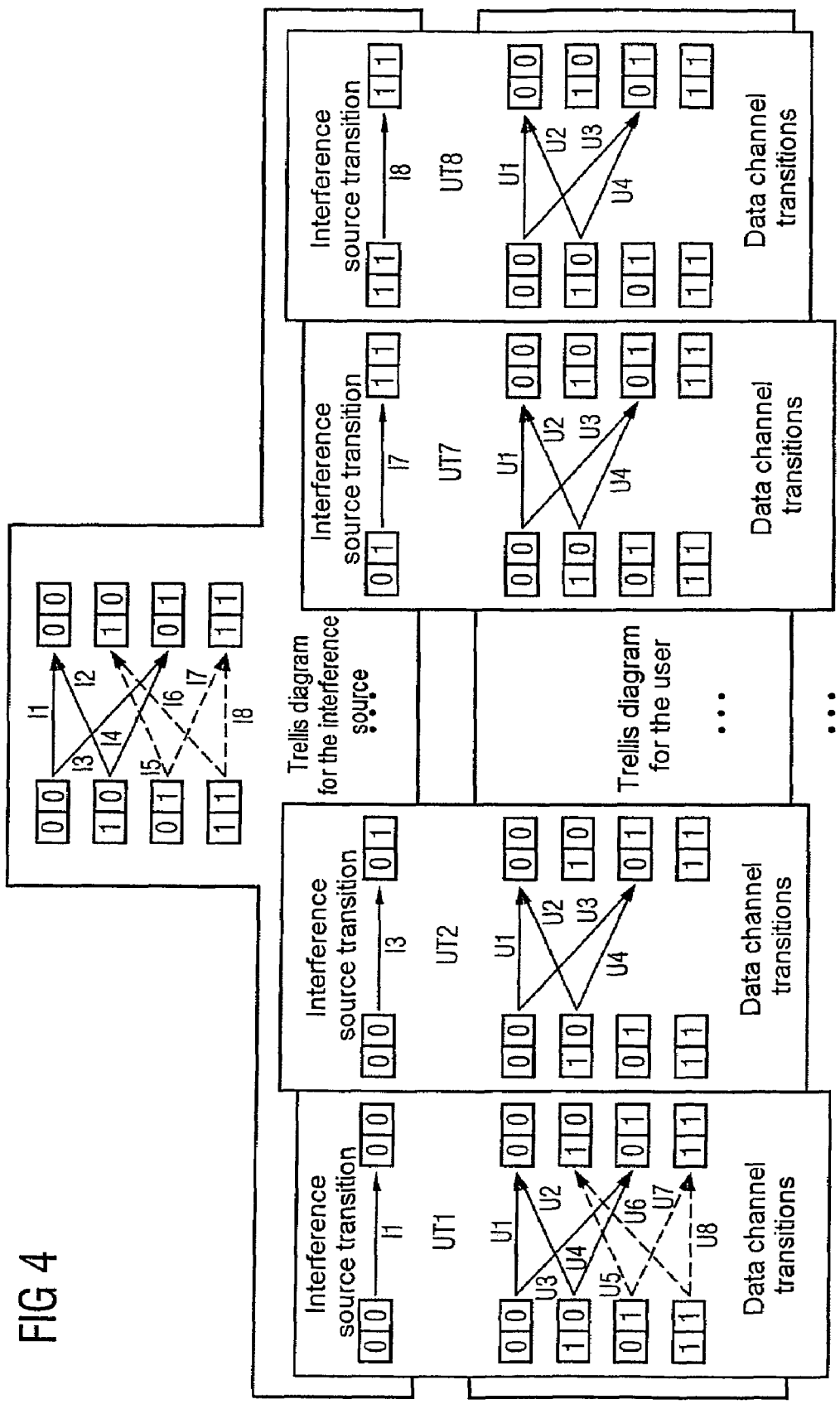
FIG. 4 shows an illustration which shows a partitioning of the overall trellis diagram into eight trellis diagrams, each of which occur subject to the condition of a specific transition in the interference channel trellis diagram, according to a first embodiment variant of the invention.

FIG. 4 shows partitioning of the overall trellis diagram, as illustrated in FIG. 3, into eight conditional trellis diagrams UT1, UT2, . . . , UT7, UT8 for the data channel. "Conditional" trellis diagrams in this context mean that each of these conditional trellis diagrams is processed subject to the condition that a specific transition I1, I2, . . . , I8 takes place in the interference channel in the same time unit. The conditional trellis diagram UT1 for the data channel shows the processing of the states for the data channel subject to the condition that the state transition I1 takes place in the interference channel. The conditional trellis diagram UT3 for the data channel shows the processing of the states for the data channel subject to the condition that the state transition I3 takes place in the interference channel. The conditional trellis diagrams UT7 and UT8 analogously presuppose the occurrence of the state transition I7 or I8, respectively, in the trellis diagram for the interference channel.

The states on which the conditional trellis diagrams UT1, UT2, . . . , UT8 are based relate solely to the data channel. The transitions I1, I2, . . . , I8 in the interference channel influence only the branch metric values for the state transitions in the trellis diagrams UT1, UT2, . . . , UT8. In other words, the transitions in the interference channel are taken into account, on the basis of the DF principle, in such a way that the transitions in the interference channel appear as partial sums in the expressions for the calculation of the branch metric values for the transitions between the states in the data channel. To this extent, the branch metric value for a specific transition Ui, i=1, 2, . . . , 8 is in general a different value in each of the conditional trellis diagrams UT1, UT2, . . . , UT8. The trellis diagram for the interference channel is likewise processed in the first method variant as illustrated in FIG. 4 in order to make it possible to provide updated interference source states in the same time unit or in the next time unit for the processing (calculation of the branch metric values) of the conditional trellis diagrams UT1, UT2, . . . , UT8 for the data channel.

FIG. 5 shows the eight conditional trellis diagrams for the data channel in an illustration in which four conditional trellis diagrams UT1, UT3, UT2, UT4 and UT5, UT7, UT6, UT8 are in each case reconfigured using a 16-state scheme. Both 16-state schemes UT1, UT3; UT2, UT4 and UT5, UT7, UT6, UT8 must be processed for one time unit. The grouping of the conditional trellis diagrams UT1, UT2, . . . , UT8 illustrated in FIG. 5 can be used when a hardware implementation is chosen, in which VA processing of groups comprising 16 states can be carried out alternately. As has already been explained with reference to FIG. 4, the influence of the interference channel is restricted to the calculation of the branch metric values. The trellis processing which is carried out 4 times in parallel in FIG. 5 does not take account of any interference channel states, so that the trellis contribution for the calculation of the branch metric values is not influenced by the interference channel either. Only the DF contribution is influenced by the interference channel. The two 16-state schemes are processed successively (within one time unit) in a hardware implementation such as this. The trellis diagram for the interference channel must then be processed in order to update the DF information for the conditional trellis diagrams UT1, UT3, UT2, UT4 and UT5, UT7, UT6, UT8 for the data channel. The best metrics within the conditional trellis diagrams for the data channel that are associated with the transition in the trellis diagram for the interference channel are used as the branch metric values for the processing of the trellis diagram for the interference channel.

Since each conditional trellis diagram UT1, UT3, UT2, UT4 and UT5, UT7, UT6, UT8 for the data channel is processed subject to the condition of there being a transition in the trellis diagram for the interference channel, the best metric within the conditional trellis diagram for the data channel is a measure of the transition probability of the transition associated with it in the trellis diagram for the interference channel.

FIG. 6 shows the processing of two conditional trellis diagrams UT and IT according to a second embodiment variant of the invention. In this case, UT denotes a 16-state trellis diagram, which takes account of conditional states of the data channel in each case subject to the precondition (condition) that the states of the interference channel are known. The processing of the "conditional" trellis diagram UT thus depends on the state of the interference channel (and not on the transition in the interference channel as in the case of the first method variant). The trellis diagram for the data channel is thus broken down into 4 (the number of possible states of the interference channel) sub-trellis diagrams, which are each associated with one specific state of the interference channel. The "conditional" trellis diagram IT for the interference channel analogously comprises sub-trellis diagrams with conditional states for the interference channel, which are each processed subject to the precondition (condition) that the states of the data channel are known. This means that the processing of the conditional trellis diagram IT for the interference channel depends not only on the states in the interference channel but also on the states in the data channel. In this case, the conditions are given by the current states of the other channel in each case.

Figure 7:
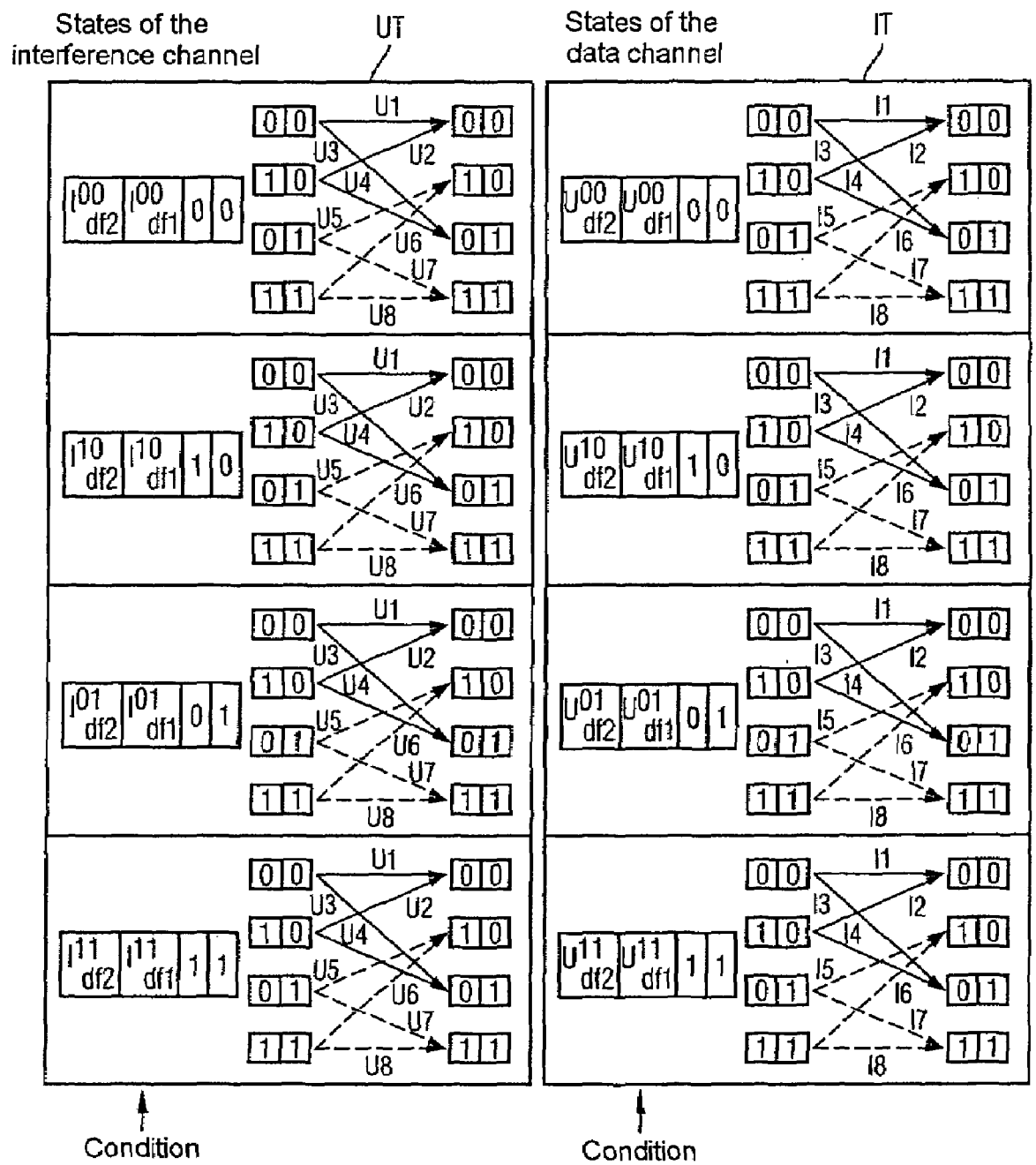
FIG. 7 shows a further illustration of the two trellis diagrams that are shown in FIG. 6, additionally indicating the DF contributions to be taken into account in the calculation of the branch metric values.

FIG. 7 shows the alternating processing of the conditional trellis diagrams UT and IT. As already mentioned, the exact state descriptions $(j_1, j_2)$, $j_1, j_2 \in \{0, 1\}$ are used for the conditions (interference source states in the trellis diagram UT, user states in the trellis diagram IT). In addition, there are in each case 2 DF bits $I^{j_1 j_2}_{df_1}$, $I^{j_1 j_2}_{df_2}$ for the state in the interference channel, and two DF bits $U^{j_1 j_2}_{df_1}$, $U^{j_1 j_2}_{df_2}$ for the state in the data channel. The respective DF bits are determined by the paths which open into the respective states $(j_1, j_2)$.

Owing to the parallel processing of 4 sub-trellis diagrams for the interference channel, there are 4 states (0, 0), 4 states (1, 0), 4 states (0, 1) and 4 states (1, 1) in the conditional trellis diagram for the interference channel—in each case related to different data channel states (condition). The state with the best metric (that is to say the smallest metric) is determined from the respective four states (0, 0) (or (1, 0), (0, 1) or (1, 1)) of the interference channel. This is the best state (0, 0) (or the best state (1, 0) or the best state (0, 1) or the best state (1, 1)) for the interference channel. The path for this respective best state for the interference channel determines the condition, and hence also the bits $I^{j_1 j_2}_{df_1}$, $I^{j_1 j_2}_{df_2}$ of the DF contribution for processing of the conditional trellis diagram for the data channel in the next time unit, or else in the current time unit.

The same method for determination of the best states for the data channel is used for determination of the conditions for processing of the trellis diagram for the interference channel.

The processing of the two conditional trellis diagrams UT and IT for the time unit k is carried out as follows:

The best paths (survivors) that open into the respective trellis states are known from the previous trellis processing activities (time unit k−1 or else k). The exact state description of the respective interference channel state $(j_1, j_2)$ as well as the associated DF bits, which result from the best path that opens into this current time unit (time unit k or else k+1) state $(j_1, j_2)$ are used for the conditions (current states of the interference channel) for the processing of the conditional trellis diagram UT for the data channel for the time unit k. These conditions (four different conditions for the processing of the conditional trellis diagram UT for the data channel) are included only as partial sums in the calculation of the branch metric values.

The conditional trellis diagram IT for the interference channel is processed in an analogous manner. The condition is in this case represented by two state bits for the current channel state of the data channel, as well as two DF bits. The two conditional trellis diagrams UT, IT are processed successively within one time unit. The two conditional trellis diagrams UT, IT are calculated and processed separately.

Figure 8:
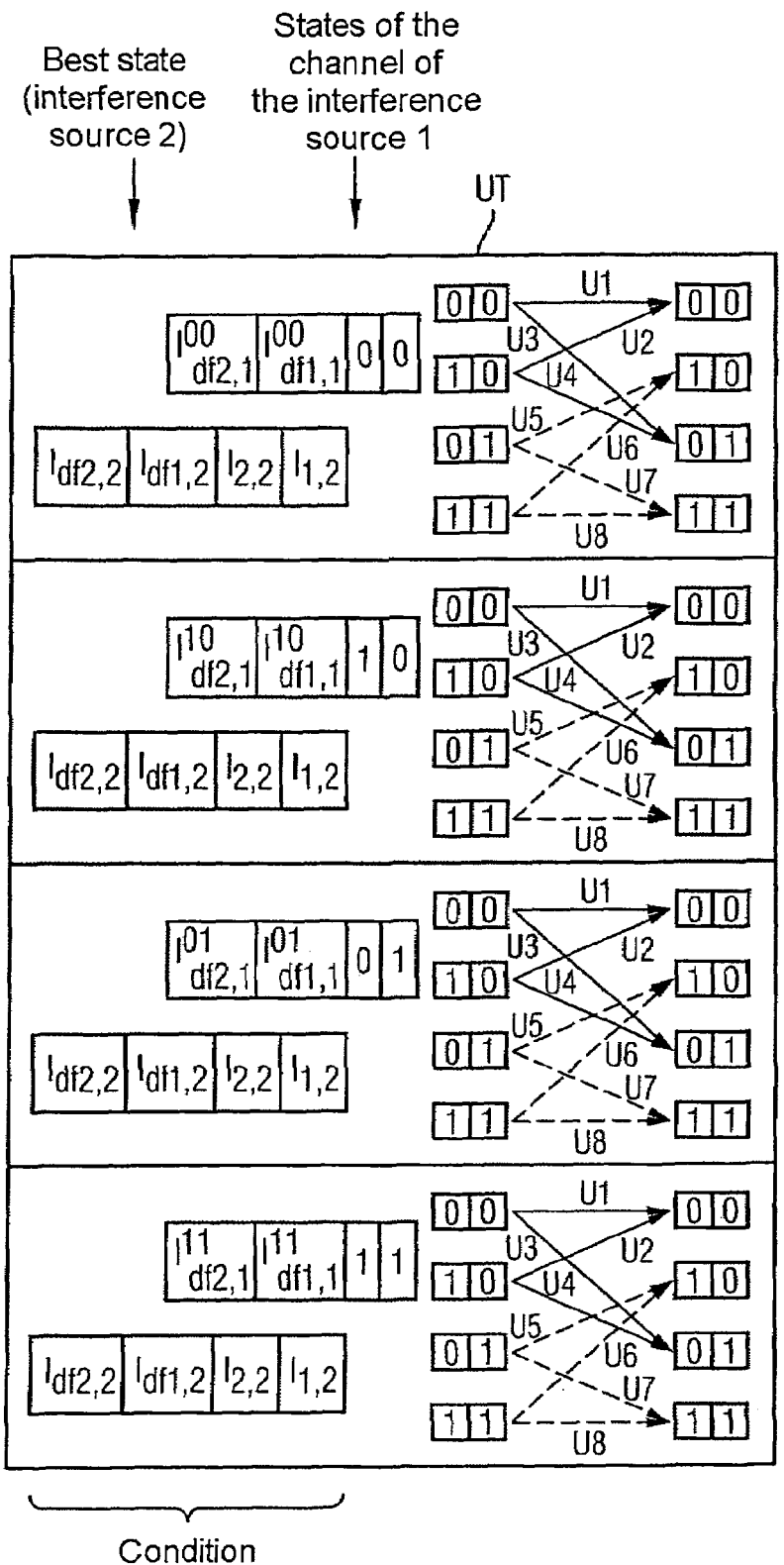
FIG. 8 shows an illustration corresponding to FIG. 7 for the situation in which one data channel and two interference channels are considered.

FIG. 8 shows the extension of the processing (as illustrated in FIG. 7) of conditional trellis diagrams in the situation where there are two interference sources, specifically an interference source 1 and an interference source 2. This results in three conditional trellis diagrams UT (for the data channel), I1T (for the channel of the interference source 1) and I2T (for the channel of the interference source 2).

These three conditional trellis diagrams are processed by analogy with the method described with reference to FIG. 7:

The conditional trellis diagram UT for the data channel is processed subject to the state conditions for the interference source 1 and the state conditions for the interference source 2. As explained with reference to FIG. 7, the exact states (in the previous time unit or else in the current time unit) are used with the DF contributions for the interference source 1. The best state calculated in the previous time unit is used for the interference source 2.

The conditional trellis diagram I1T for the channel for the interference source 1 is processed subject to the state conditions for the data channel and the state conditions for the interference source 2. The exact states (in the previous time unit or else in the current time unit) together with the DF contributions are used for the data channel. The best state calculated in the previous time unit is used for the interference source 2.

The conditional trellis diagram I2T for the channel for the interference source 2 is processed subject to the state conditions for the data channel and the state conditions for the interference source 1. The exact states (in the previous time unit or else in the current time unit) together with the DF contributions are used for the data channel. The best state calculated in the previous time unit is used for the interference source 1.

In this case, the following notations are used for indication of the conditions in FIG. 8. The DF bits for the interference source 1 relating to an exact state $(j_2, j_1)$ are denoted by $I^{j_2 j_1}_{df_2,1}$, $I^{j_2 j_1}_{df_1,1}$, that is to say, $(I^{00}_{df_2,1}, I^{00}_{df_1,1}, 0, 0,)$ indicates the 4-bit condition for the channel for the interference source 1 occurring in the same time unit in the exact state (0, 0) during the processing of the conditional trellis diagram UT, with the two associated DF bits $I^{00}_{df_2,1}$, $I^{00}_{df_1,1}$ being taken into account.

The two DF bits for the data channel relating to the exact state $(j_2, j_1)$ are denoted in an analogous manner by $U^{j_2 j_1}_{df_2}$, $U^{j_2 j_1}_{df_1}$. That is to say the 4 bits $(U^{00}_{df_2}, U^{00}_{df_1}, 0, 0)$ are taken into account in the calculation of the branch metric values during the processing of the conditional trellis diagram I1T for the interference source 1 and during the processing of the conditional trellis diagram I2T for the interference source 2, for example relating to the exact state (0, 0) of the data channel in the same time unit. The consideration of the exact states of the other channel in this alternating manner is carried out as described in the explanatory notes relating to FIG. 7.

As already mentioned, the interference source 2 is not taken into account on the basis of its exact state in the same time unit k during the processing of the conditional trellis diagram UT but on the basis of the best state determined in the previous time unit or in the current time unit (k−1 or k) respectively. The best state is, as already mentioned, that state which has the smallest path metric for all 4 (number of the conditions)×4 (number of states)=16 conditional states of the conditional trellis diagram I2T in the previous time unit or in the current time unit during the processing of the conditional trellis diagram I2T. This state is indicated by the two bits ($I_{2,2}$, $I_{1,2}$). Two associated DF bits are denoted by $I_{df2,2}$, $I_{df1,2}$ in FIG. 8. The DF bits are obtained from the path that leads in the best state to the time unit k−1 or else to the current time unit k. The calculation of the branch metric values for the processing of the conditional trellis diagram UT for the data channel thus always includes a partial sum, which is determined by the 4 bits ($I_{df2,2}$, $I_{df1,2}$, $I_{2,2}$, $I_{1,2}$) for taking account of information from the channel for the interference source 2.

As can be seen from FIG. 8, the same 4 bits are also taken into account in the processing of the conditional trellis diagram I1T for the interference source 1. The 4 bits which are denoted ($I_{df2,1}$, $I_{df1,1}$, $I_{2,1}$, $I_{1,1}$) are used in an analogous manner for the processing of the conditional trellis diagram I2T for the interference source 2, with $I_{df2,1}$, $I_{df1,1}$ denoting two DF bits relating to the best state ($I_{2,1}$, $I_{1,1}$) of the interference source 1 in the previous time unit or else in the current time unit.

It should be mentioned that the partial sum which occurs in the calculation of the branch metric values relating to the best states for the processing of the respective conditional trellis diagram UT, I1T, I2T—that is to say via the 4 sub-trellis diagrams—remains constant. In contrast to this, four different partial sums occur during the processing of each of the conditional trellis diagrams UT, I1T, I2T for that channel (UT: channel for the interference source 1; I1T and I2T: data channel) whose exact (current) states are taken into account in the condition. Both the best paths and the exact state paths are updated from one time unit to the next.

The three conditional trellis diagrams UT, I1T, I2T are processed successively within one time unit.

FIGS. 9 to 11 show the third method variant of the invention. The third method variant differs from the second method variant in that the best path for the data channel, for the channel for the interference source 1 and for the channel for the interference source 2 is always used for the state conditions (as determined in the previous time unit or else in the current time unit). Since exact (current) states of an adjacent channel are no longer considered, the conditional trellis diagrams are reduced to the transitions between four states in each case. The diagrams are not split into sub-trellis diagrams.

FIG. 9 shows the situation when a single interference source is present. The conditional trellis diagram for the data channel is annotated UT'. The 2 bits ($I_2$, $I_1$) of the best state of the interference channel as determined in the previous time unit or else in the current time unit as well as 2 DF bits $I_{df2}$, $I_{df1}$ are taken into account in the processing of the conditional trellis diagram UT' for the calculation of the branch metric values for the state transitions in the conditional trellis diagram UT'. 2 bits ($U_2$, $U_1$) are taken into account in an analogous manner during the processing of the conditional trellis diagram for the interference channel IT', which bits indicate the best state of the data channel in the previous time unit or else in the current time unit, as well as the 2 associated DF bits $U_{df2}$, $U_{df1}$ for the data channel. The two conditional trellis diagrams UT', IT' are in each case processed once, alternately, in each time unit.

FIG. 10 shows the three conditional trellis diagrams UT' for the data channel, I1T' for the channel for the interference source 1 and I2T' for the channel for the interference source 2 for the third method variant of the invention. On the basis of the notation that has already been explained, the only condition taken into account is the best states, as determined in the previous time unit or else in the current time unit, for the adjacent channels, and in each case 2 DF bits relating to these best states. The information from the adjacent channels is thus only included in the calculation of the branch metric values, but is not included in the definition of the trellis states in the individual "conditional" trellis diagrams UT', I1T', I2T'. As in the case of the second method variant (FIG. 8), all three conditional trellis diagrams UT', I1T', I2T' must be processed for equalization of a symbol (that is to say the trellis processing of a time unit).

In comparison to a conventional equalization process without taking account of interference channels, the following additional implementation complexity must be accepted for the second method variant (FIGS. 7 and 8):

a) The state representations (exact states, DF bits) for the interference channel or channels must be calculated.

b) The state representations (best states, DF bits) relating to the best states for the data channel and for the interference channel or channels must be calculated repeatedly for, in each case, four states (sub-trellis diagram) from the conditional 16-state trellis diagram.

c) The branch metric values must be calculated subject to the influence of the condition information (state representations according to a) and b)) relating to the states of the data channel and to the states of the interference channel or channels.

This avoids the computation and hardware complexity mentioned in item b) for the third method variant.

The conditions for the processing of the conditional trellis diagrams may be determined either in the previous time unit or else in the current time unit. For example, in the third embodiment variant, a trellis diagram for the data channel and a trellis diagram for the interference channel are processed alternately. If each channel is intended to be processed with a DF contribution for the respective other channel, there are two options:

1. The best path in a trellis diagram for the previous time unit is in each case used as the DF contribution for processing of the trellis diagram for the respective other channel.

2. The trellis diagram for the data channel is processed twice in each time unit. On the first occasion, the trellis diagram for the data channel is processed without any DF contribution for the interference source. This is used to determine the best path for the data channel, which is used as the DF contribution for the processing of the interference channel. The data channel is then processed for a second time, with the DF contribution, on behalf of the interference channel. This procedure is illustrated in FIG. 12. Relationships may, of course, be reversed, with the trellis diagram for the interference channel being processed twice, instead of the trellis diagram for the data channel.

The second option thus involves more complexity since a further trellis diagram must additionally be processed in each time unit. In contrast, the calculation accuracy is improved, since the current symbol is taken into account in the DF contribution in the current time unit.

The illustrations in FIGS. 9 and 10 (third embodiment variant) can be extended in a simple manner for $L_{DF}=4$ (16 states), $L_{DF}=5$ (32 states), etc. The left-hand part of FIG. 11 shows the two trellis diagrams for the data channel and for an interference channel for the time unit k+1, that is to say for a transition from the time unit k to the time unit k+1. The 16 states in the two trellis diagrams v=0, . . . , 15 are defined, in a bit-inverted sequence, as follows:

state v=0: 0000
state v=1: 1000
state v=2: 0100
. . .
state v=14: 0111
state v=15: 1111.

By way of example, a butterfly is shown in the trellis diagrams, and is defined by the transitions 0→0, 1→0, 0→8, 1→8. The current bit that produces the respective transitions is annotated $a_{U0}$ for the data channel and $a_{I0}$ for the interference channel. The previous states for the data channel are denoted by the 4-tuple ($a_{U4}$, $a_{U3}$, $a_{U2}$, $a_{U1}$) and the previous states for the interference channel are denoted by the 4-tuple ($a_{I4}$, $a_{I3}$, $a_{I2}$, $a_{I1}$)

The time unit k+1 will be considered first of all. The analysis is based on the assumption that the interference contribution (user contribution) to the processing of the trellis diagram for the user (trellis diagram for the interference source) was determined in the previous time unit k or else in the current time unit k+1 itself.

Step 1: The data channel (16 states) is processed with its own DF bit $a_{U5}$ and 5 DF bits $a_{I1}$, $a_{I2}$, . . . , $a_{I5}$ for the interference channel (general case: the data channel is processed with no bits or with one or more of its own DF bits and any desired number of DF bits for the interference channel). The DF bit $a_{U5}$ for the data channel was determined in a previous time unit during the processing of the data channel trellis diagram. The DF bits for the interference channel represent the best path, which was determined during the processing of the trellis diagram for the interference channel in the previous time unit or else in the current time unit.

Step 2: The interference channel (16 states) is processed with its own DF bit $a_{I5}$ and 5 DF bits $a_{U1}$, $a_{U2}$, . . . , $a_{U5}$ for the data channel (general case: the interference channel is processed with no bits or with one or more of its own DF bits and any desired number of DF bits for the data channel). The DF bit $a_{I5}$ for the interference channel was determined in a previous time unit during the processing of the interference channel trellis diagram. The DF bits for the data channel represent the best path, which was determined during the processing of the trellis diagram for the data channel in the previous time unit or else in the current time unit.

The soft and hard output values are derived from the first step (equalization of the data channel using DF bits from the interference channel). Soft and hard output values for the interference channel are derived from the second step (equalization of the interference channel using DF bits from the data channel). Hard output values from both the data channel and the interference channel can be used for further channel estimation (channel tracking; refreshing of the channel coefficients for the user and for the interference source).

The expressions for calculation of the branch metric values $BMU_k$ for the processing of the trellis diagram for the data channel in the time unit k+1, and $BMI_k$ for the processing of the trellis diagram for the interference channel in the time unit k+1 will be described in the following text for the example illustrated in FIG. 11.

The calculations of the branch metric values $BMU_k$, $BMI_k$ can be carried out in the normal manner with the aid of the filtered received data $x_{Uk}$ (filtered with the input filter for the data channel) and $x_{Ik}$ (filtered with the input filter for the interference channel) and the channel coefficients $h_{Ui}$ for the data channel, and the channel coefficients $h_{Ii}$ for the interference channel.

$$BMU_k = \left| x_{Uk} - \left( \underbrace{\sum_{i=1}^{5} h_{Ii}(1 - 2 \cdot a_{Ii})}_{\substack{DF\ contribution \\ interference\ source}} + \underbrace{\sum_{i=1}^{5} h_{Ui}(1 - 2 \cdot a_{Ui})}_{\substack{DF\ contribution \\ user\ and\ trellis \\ contribution\ user}} + \underbrace{h_{U0}(1 - 2 \cdot a_{U0})}_{\substack{Hyp.\ symb. \\ contribution\ user}} \right) \right|^2 \quad (5)$$

$$BMI_k = \left| x_{Ik} - \left( \underbrace{\sum_{i=1}^{5} h_{Ui}(1 - 2 \cdot a_{Ui})}_{\substack{DF\ contribution\ user}} + \underbrace{\sum_{i=1}^{5} h_{Ii}(1 - 2 \cdot a_{Ii})}_{\substack{DF\ contribution \\ interference\ source\ and \\ trellis\ contribution \\ interference\ source}} + \underbrace{h_{I0}(1 - 2 \cdot a_{I0})}_{\substack{Hyp.\ symb. \\ contribution \\ interference \\ source}} \right) \right|^2 \quad (6)$$

The first partial sum in the above equations (5) and (6) in each case includes the information for the adjacent channel in the form of a DF contribution, calculated on the basis of the best path for the adjacent channel as calculated in the previous time unit or else in the current time unit. The second partial sum takes account of the current trellis states and—optionally—a DF contribution (in this case only a single bit $a_{U5}$ or $a_{I5}$, respectively) for the channel under consideration. The last product takes account of the currently considered transition in the respective trellis diagram.

After the processing of the two trellis diagrams in the time unit k+1, the processing of the two trellis diagrams as described above is repeated in the time unit k+2 on the basis of the determined best paths. FIG. 11 illustrates only the processing of the trellis diagram for the data channel for the time unit k+2.

Although the invention has been illustrated and described with respect to one or more implementations, alterations and/or modifications may be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method for equalization of a signal that is transmitted via a data channel based on a decision feedback (DF) method, and taking account of at least one interference channel, comprising:
processing at least two trellis diagrams in each time unit, with the states of at least one of the trellis diagrams partially or exclusively describing the data channel, and a DF contribution that is used for the processing of the at least one trellis diagram including information about the at least one interference channel.

2. The method according to claim 1, wherein the at least one trellis diagram comprises states that describe exclusively the data channel is processed in each time unit.

3. The method according to claim 2, wherein the DF contribution that contains the information about the at least one interference channel is obtained by processing a trellis diagram for the at least one interference channel.

4. The method according to claim 2, wherein the states of the at least one trellis diagram describe the data channel subject to a condition that state transitions are assumed to occur in the at least one interference channel.

5. The method according to claim 2, wherein the DF contribution takes account of information about the at least one interference channel, and the at least two trellis diagrams describe exclusively the data channel and are processed in each time unit.

6. The method according to claim 1, wherein the states of one of the at least two trellis diagrams describe the data channel subject to a condition of assumed states in the at least one interference channel, and the information that is contained in the DF contribution that is used for processing of the one of the at least two trellis diagrams for the at least one interference channel is determined by trellis processing of the at least one interference channel.

7. The method according to claim 6, wherein the at least one interference channel comprises a single interference channel, and wherein a trellis diagram associated with the single interference channel and a trellis diagram partially or exclusively describing the data channel are processed in each time unit, wherein the states of the trellis diagram associated with the single interference channel describe the single interference channel subject to a condition of assumed states in the single interference channel, and wherein a DF contribution that is used for processing of the trellis diagram associated with the single interference channel includes information about the data channel.

8. The method according to claim 1, wherein the states of the at least one trellis diagram that describe the data channel describe the data channel subject to a condition of current states in the at least one interference channel.

9. The method according to claim 1, wherein the at least one interference channel comprises two interference channels, and wherein the at least two trellis diagrams comprise three trellis diagrams, and wherein the three trellis diagrams are processed in each time unit, and wherein the states of the trellis diagrams associated with the two interference channels describe a first interference channel subject to a condition of assumed states in the data channel, and describe a second interference channel subject to a condition of assumed states in the data channel, and wherein a DF contribution that is used for processing of the trellis diagrams associated with the two interference channels in each case includes information about the data channel and about the respective other interference channel.

10. The method according to claim 1, wherein the states of one of the at least two trellis diagrams describe the data channel, the states of another of the at least two trellis diagrams describe one interference channel, wherein the information that is contained in the DF contribution that is used for processing of the trellis diagram that describes the data channel is determined by trellis processing of the trellis diagram that describes the interference channel, and the information that is contained in the DF contribution that is used for processing of the trellis diagram that describes the one interference channel is determined by trellis processing of the trellis diagram that describes the data channel.

11. The method according to claim 10, wherein the information that is included in the DF contributions is, in each case, determined by trellis processing of the respective other channel of the data channel and the one interference channel in the previous or in the current time unit.

12. The method according to claim 10, wherein the at least one interference channel comprises a single interference channel, and wherein two trellis diagrams, one associated with the data channel and one associated with the single interference channel are processed in each time unit.

13. The method according to claim 10, wherein the at least one interference channel comprises two interference channels, and wherein three trellis diagrams, one associated with the data channel and two associated with the two interference channels, respectively, are processed in each time unit.

14. The method according to claim 12, wherein in order to provide DF contributions within a current time unit, at least one additional trellis diagram for the data channel or interference channel is processed without any DF contribution within the current time unit, and the DF contribution for the interference channel or for the data channel, respectively, is determined in the same time unit during the processing of the at least one additional trellis diagram for that data channel or interference channel, respectively.

* * * * *